United States Patent
Kim et al.

(10) Patent No.: US 9,048,444 B2
(45) Date of Patent: Jun. 2, 2015

(54) FLEXIBLE DISPLAY DEVICE AND METHOD OF FABRICATING THE SAME

(71) Applicant: LG Display Co., Ltd., Seoul (KR)

(72) Inventors: Jong-Moo Kim, Seoul (KR); Juhn-Suk Yoo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/302,312

(22) Filed: Jun. 11, 2014

(65) Prior Publication Data

US 2015/0021570 A1    Jan. 22, 2015

(30) Foreign Application Priority Data

Jul. 19, 2013    (KR) .................. 10-2013-0085412

(51) Int. Cl.
| | |
|---|---|
| H01L 51/00 | (2006.01) |
| H01L 51/52 | (2006.01) |
| H01L 51/56 | (2006.01) |
| G09F 9/30 | (2006.01) |
| H01L 27/32 | (2006.01) |

(52) U.S. Cl.
CPC ........ *H01L 51/0097* (2013.01); *H01L 51/5293* (2013.01); *H01L 51/56* (2013.01); *G09F 9/301* (2013.01); *H01L 27/3276* (2013.01); *H01L 2251/5338* (2013.01)

(58) Field of Classification Search
USPC ........................................... 257/40
See application file for complete search history.

(56) References Cited

U.S. PATENT DOCUMENTS

| | | | |
|---|---|---|---|
| 2011/0050657 | A1 | 3/2011 | Yamada |
| 2011/0260180 | A1* | 10/2011 | Kuranaga et al. ............ 257/88 |
| 2012/0218219 | A1 | 8/2012 | Rappoport et al. |
| 2013/0057801 | A1* | 3/2013 | Park et al. ................ 349/58 |
| 2013/0076268 | A1* | 3/2013 | Choi et al. ............... 315/312 |
| 2013/0089954 | A1* | 4/2013 | Ro et al. .................. 438/113 |
| 2013/0193415 | A1 | 8/2013 | Choi et al. |
| 2015/0021570 | A1* | 1/2015 | Kim et al. ................. 257/40 |

FOREIGN PATENT DOCUMENTS

| | | |
|---|---|---|
| EP | 1 933 196 A2 | 6/2008 |
| KR | 10-1190630 B1 | 10/2012 |

OTHER PUBLICATIONS

European Patent Office, Search Report and Opinion, EP Patent Application No. 14173390.7, Jan. 16, 2015, seven pages.

* cited by examiner

*Primary Examiner* — Thao P Le
(74) *Attorney, Agent, or Firm* — Fenwick & West LLP

(57) ABSTRACT

A flexible display device includes a display panel including a plastic substrate where an organic light emitting diode and a thin film transistor are formed; a circuit portion applying a power signal and a data signal, which are supplied from an external portion, to the display panel; and a support member coupled to the plastic substrate, wherein the display panel and the circuit portion are bent around the support member.

16 Claims, 7 Drawing Sheets

FLEXIBLE DISPLAY DEVICE AND METHOD OF FABRICATING THE SAME

CROSS-REFERENCE TO RELATED APPLICATION

The present application claims the priority benefit of Korean Patent Application No. 10-2013-0085412 filed in Republic of Korea on Jul. 19, 2013, which is hereby incorporated by reference in its entirety.

BACKGROUND

1. Field of the Disclosure

The present disclosure relates to a flexible display device and a method of fabricating the same.

2. Discussion of the Prior Art

Recently, flexible display devices using organic light emitting diodes (OLEDs) have been widely developed.

In more detail, categories of OLEDs include a passive matrix type and an active matrix type according to a driving method.

Further, OLEDs may be categorized into a top emission type emitting light to a top surface, a bottom emission type emitting light to a substrate where a thin film transistor (TFT) is formed (e.g., to a bottom surface), and a dual emission type emitting light to both the top surface and the bottom surface.

The flexible display device generally includes a plastic substrate that is flexible and capable of being bent, an OLED element, and a passivation element that can endure bending.

Further, the flexible display device is designed to have a structure that can endure a specific bending radius according to the purpose of application and the field of application.

The bending radius is a radius of a bent surface when bending the flexible display device, and as the bending radius becomes smaller, the fields of application are various and the quality of the flexible display device increases. However, currently, the OLED element, the passivation element, and the materials thereof are limited, and thus reliability is reduced.

FIG. 1 is a cross-sectional view illustrating a flexible display device 10 according to the prior art.

Referring to FIG. 1, the flexible display device 10 includes a plastic substrate 11, a TFT and OLED element layer 12 formed on the plastic substrate 11, an encapsulation portion 13 protecting the TFT and OLED element layer 12, a circuit portion 14 applying a power signal and a data signal, which are supplied from an external portion, to the element layer 12, and a bottom film 15 protecting a bottom of the plastic substrate 11.

The circuit portion 14 includes an IC (integrated circuit) pad portion 14a of a COF (chip on film) type or a COG (chip on glass) type, which is formed on the plastic substrate 11, a resin layer 14b protecting the IC pad portion 14a, and a flexible printed circuit substrate 14c connected to the IC pad portion 14a.

An upper peripheral area A1 and a circuit portion area A2 of the flexible display device 10 are generally in a non-luminous area, and the non-luminous areas A1 and A2 are bent to achieve a thin profile and miniaturization of the display device.

However, a bending stress is applied to the non-luminous area A1 and A2 in the bending process, and thus the circuit portion 14, the plastic substrate 11, or the OLED element layer 12 is destroyed.

Further, in the bending process, the bent area does not maintain a constant bending radius.

SUMMARY OF THE INVENTION

Accordingly, the present invention is directed to a flexible display device including a support member capable of easily bending a plastic substrate, and a method of fabricating the same.

Additional features and advantages of the invention will be set forth in the description that follows, and in part will be apparent from the description, or may be learned by practice of the invention. The objectives and other advantages of the invention will be realized and attained by the structure particularly pointed out in the written description and claims herein as well as the appended drawings.

To achieve these and other advantages and in accordance with the purpose of the present invention, as embodied and broadly described herein, a flexible display device includes a display panel including a plastic substrate where an organic light emitting diode and a thin film transistor are formed; a circuit portion applying a power signal and a data signal, which are supplied from an external portion, to the display panel; and a support member coupled to the plastic substrate, wherein the display panel and the circuit portion are bent around the support member.

In another aspect, a method of fabricating a flexible display device includes preparing a display panel including a plastic substrate on which an organic light emitting diode and a thin film transistor are formed; preparing a support member; coupling the display panel to the support member; and bending the display panel along a side surface of the support member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to exemplary embodiments, which are illustrated in the accompanying drawings.

Figure 1:
FIG. 1 is a cross-sectional view illustrating a flexible display device according to the prior art.
Figure 2:
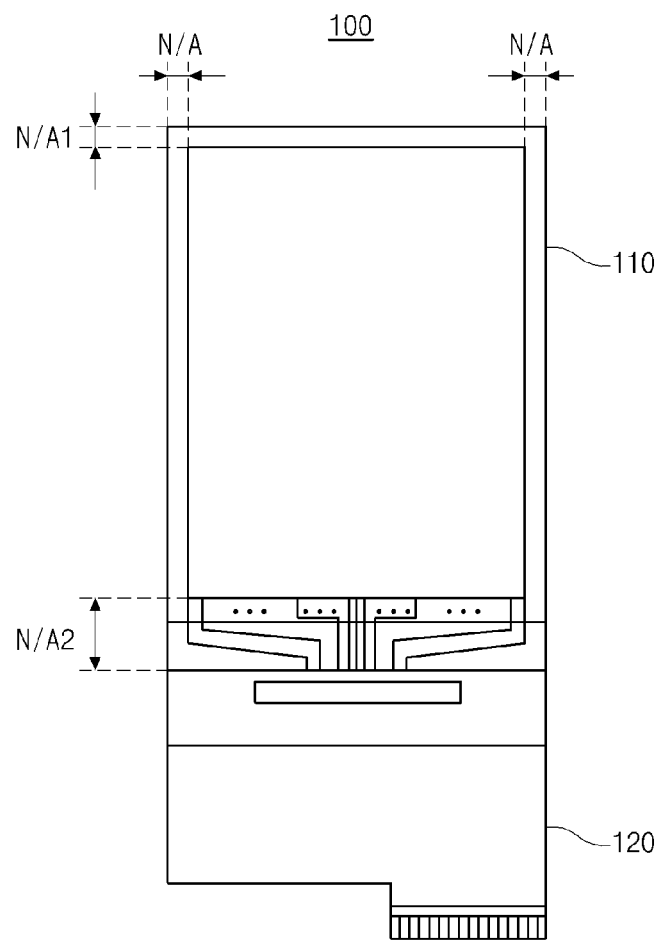
FIGS. 2 and 3 are a plan view and a cross-sectional view, respectively, illustrating a flexible display device before the device is bent according to an embodiment of the present invention, respectively.
Figure 3:
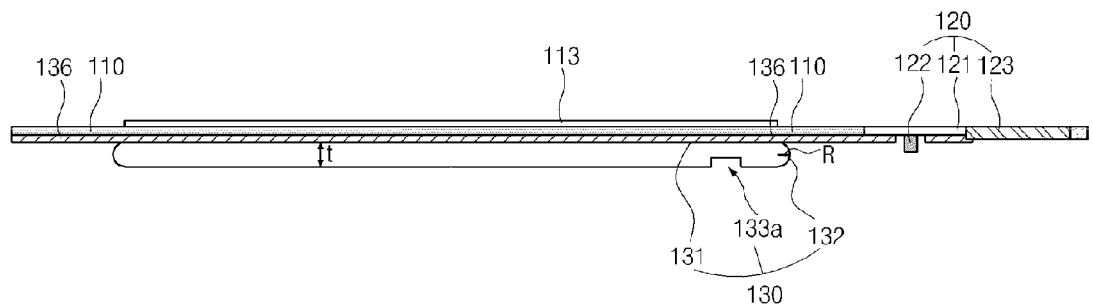

FIGS. 2 and 3 are a plan view and a cross-sectional view, respectively, illustrating a flexible display device 100 before the device is bent according to an embodiment of the present invention, respectively. FIG. 4 is a cross-sectional view illustrating various examples of a support member according to an embodiment of the present invention, and FIG. 5 is a cross-sectional view illustrating the flexible display device 100 after the device is bent according to an embodiment of the present invention.

As shown in the drawings, the flexible display device 100 includes a display panel 110, a circuit portion 120, and a support member 130. The display panel 110 and the circuit portion 120 are bent around the support member 130 to make the flexible display panel 100.

In more detail, the display panel 110 is formed of a plastic substrate where an OLED and a TFT are formed, and non-luminous areas such as non-active areas N/A, N/A1, and N/A2 may be formed at peripheral areas of the display panel 110.

The circuit portion 120 is for applying a power signal and a data signal, which are supplied from the external portion, to the display panel 110.

The circuit portion 120 may be formed as a COF, and an IC element may be formed on the COF.

In more detail, referring to FIG. 3, the circuit portion 120 includes a COF 121 electrically connected to the display panel 110, an IC element 122 coupled to the COF 121 on a surface of the COF 121, and a FPCB (flexible printed circuit board) 123 supplied with the power signal and the data signal from the external portion.

The IC element 122 may be a drive-IC (D-IC) element.

The support member 130 is coupled to the plastic substrate that forms the display panel 110.

In more detail, referring to FIG. 3, the support member 130 includes a flat surface 131 coupled to the plastic substrate, an outer rounded surface such as a side surface 132 having a constant bending radius R, and an accommodation portion 133a accommodating the IC element 122.

The support member 130 may be made of stainless steel (SUS), magnesium (Mg), rubber, graphene, Teflon, PDMS (polydimethylsiloxane), urethane, or PVC (polyvinyl chloride) films, for example.

The ratio of the bending radius R to the thickness t of the support member 130 may be between 0.2 and 0.8, and preferably 0.5.

For example, if the thickness t of the support member 130 is 100 μm (micrometers), the radius R may be 0.05 mm (millimeters).

The support member 130 may be formed in various forms, as shown in FIG. 4.

Figure 4A:
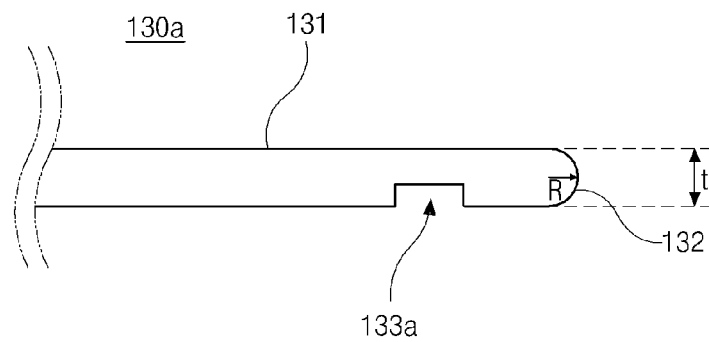
FIGS. 4A to 4D are cross-sectional views illustrating various examples of a support member according to an embodiment of the present invention.
Figure 5:
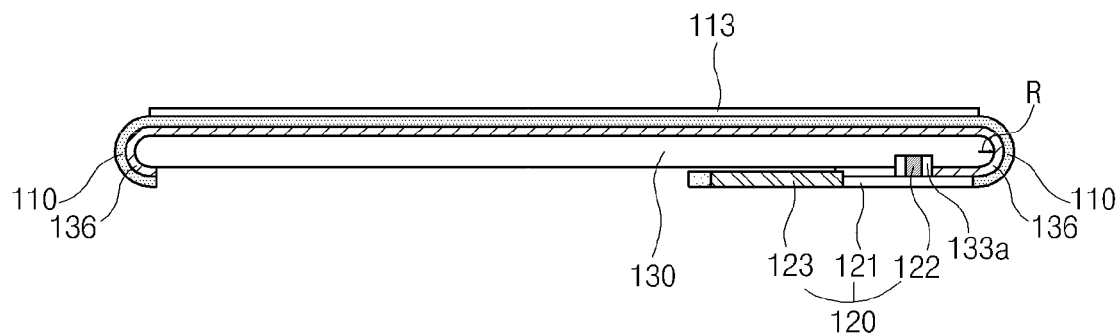
FIG. 5 is a cross-sectional view illustrating the flexible display device after the device is bent according to an embodiment of the present invention.

In more detail, referring to FIG. 4A, the accommodation portion 133a of the support member 130a may be formed in a groove shape to accommodate the IC element 122.

Figure 4B:
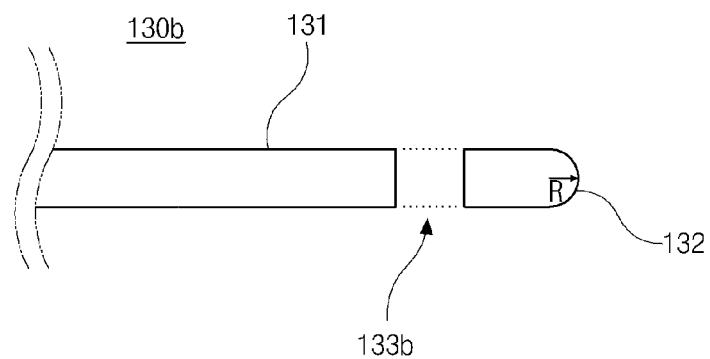

Alternatively, referring to FIG. 4B, the accommodation portion 133b of the support member 130b may be formed in a hole shape to accommodate the IC element 122.

Figure 4C:
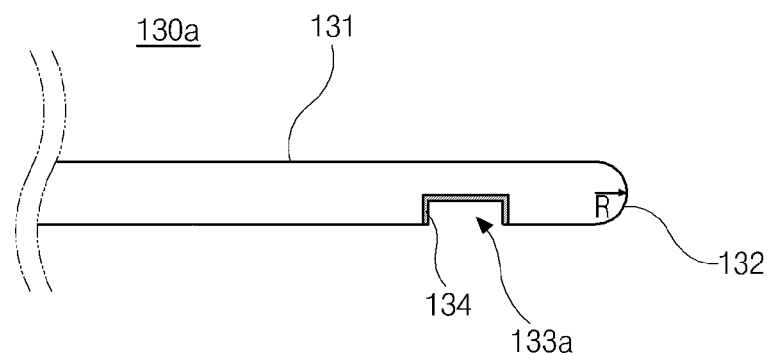

Alternatively, referring to FIG. 4C, an insulator 134 may be coupled to the inner surface of the accommodation portion 133a formed in the groove shape.

Figure 4D:
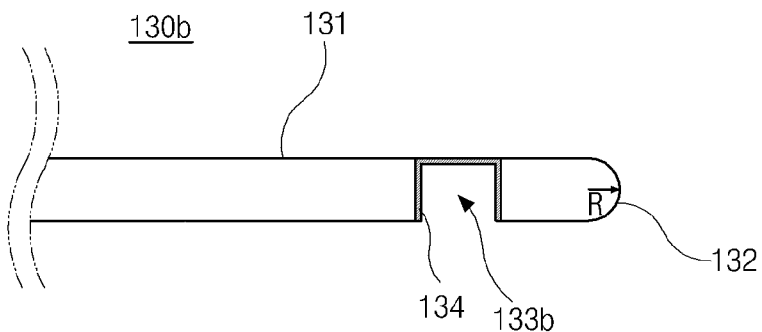

Alternatively, referring to FIG. 4D, an insulator 134 may be coupled to the accommodation portion 133b formed in the hole shape.

Accordingly, referring to FIGS. 4A-4D and 5, the insulator 134 may be coupled to the accommodation portion 133 (133a or 133b) in the support member 130 (130a or 130b) to advantageously prevent transfer of electromagnetic waves from the IC element 122 to the support member 130 when the IC element 122 is inserted into the accommodation portion 133.

Figure 6:
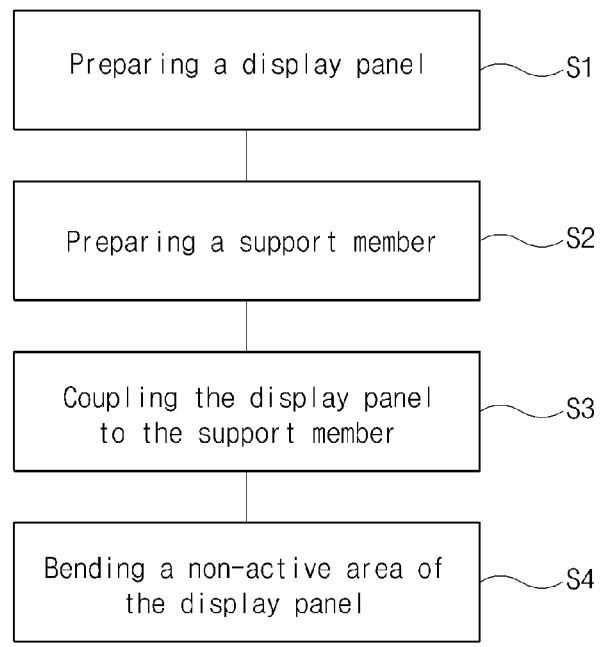
FIG. 6 is a schematic flow chart illustrating a method of fabricating the flexible display device according to an embodiment of the present invention.

FIG. 6 is a schematic flow chart illustrating a method of fabricating the flexible display device according to an embodiment of the present invention, and FIGS. 7A to 7F are views illustrating the method of fabricating the flexible display device according to an embodiment of the present invention.

The flexible display device 100 may be fabricated with four steps (S1 to S4).

First, the display panel 110, including the plastic substrate where the OLED and TFT are formed, is prepared (step S1).

Then, the support member 130 having the side surface 132 of the constant bending radius R is prepared (step S2).

Then, the display panel 110 is coupled to the support member 130 (step S3).

Then, the non-active areas N/A, N/A1, and N/A2 of the display panel 110 may be selectively bent around the side surface 132 of the support member 130 (step S4).

In this regard, at least one area of the non-display areas N/A, N/A1, and N/A2 may be selectively bent.

In more detail, the step S2 of preparing the support member 130 is as follows.

Figure 7A:
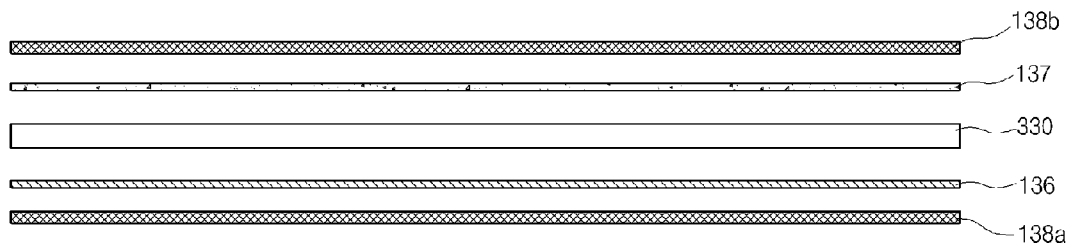
FIGS. 7A to 7F are views illustrating a method of fabricating the flexible display device according to an embodiment of the present invention.

First, referring to FIG. 7A, a base support member 330 that becomes the support member 130 having the constant bending radius R at the side surface 132 later is prepared.

A first optically transparent adhesive 136 is coated on a surface of the base support member 330, and a second optically transparent adhesive 137 is coated on an opposite surface of the base support member 330.

The first optically transparent adhesive 136 may have an adhesion strength higher than the second optically transparent adhesive 137 so that the first optically transparent adhesive 136 is coupled to the display panel 110. The first and second optically transparent adhesives 136 and 137 may be made of OCA (optical clear adhesive).

Then, protective films 138a and 138b are attached to the first and second optically transparent adhesives 136 and 137, respectively.

Figure 7B:
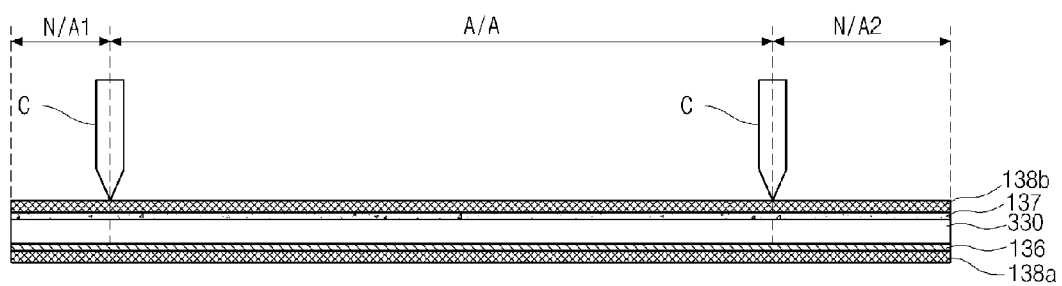
Figure 7C:
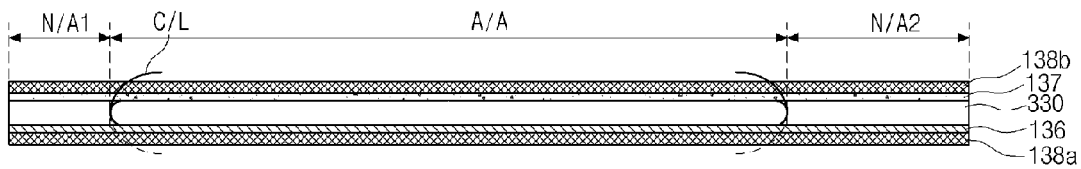

Then, referring to FIGS. 7B and 7C, the constant bending radius is formed at the side surface of the base support member 330.

In more detail, the side surface of the base support member 330 is cut round such that the area of the base support member 330 corresponds to a luminous area (i.e., an active area A/A) of the display panel 110. To do this, a platen die cutting apparatus C may be used, which selectively cuts films.

In other words, referring to FIG. 7B, the area of the base support member 330 may correspond to the area of the display panel 110 except for the non-active areas N/A1 and N/A2.

Further, the support member 130 may extend to the direction of the non-active area N/A2 where the circuit portion 120 is formed.

Accordingly, the support member 130 may cover a part of the non-active area N/A2 for the circuit 120.

Referring to FIG. 7C, the cutting apparatus C makes round cuts along the cutting lines C/L in order to form the constant bending radius at the side surface of the base support member 330.

Figure 7D:
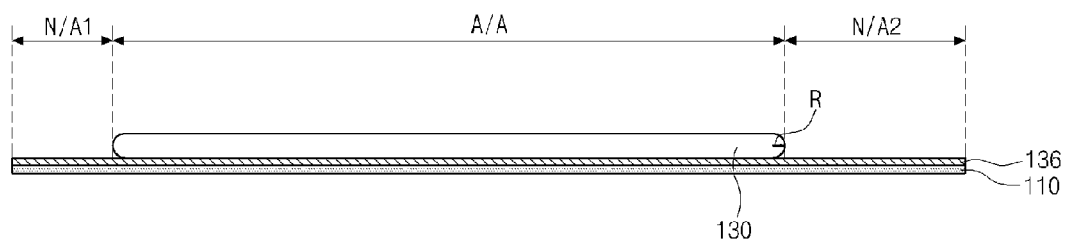

The above explanation relates to bending the non-active areas N/A1 and N/A2 located at the top and bottom side of the flexible display device 100. Alternatively, as shown in FIG. 7D, other non-active areas N/A may be bent in a similar manner.

Figure 7E:
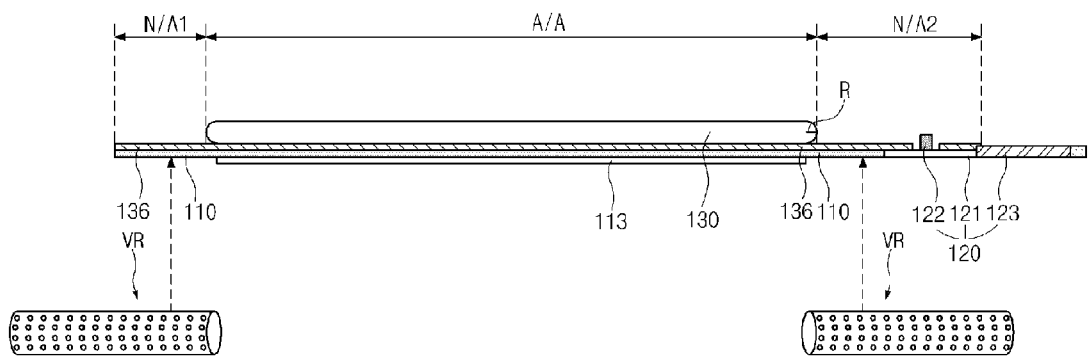

Then, referring to FIG. 7E, after cutting the side surface of the base support member 330, the protective film 138a attached to the first optically transparent adhesive 136 and the protective film 138b attached to the second optically transparent adhesive 137 are removed.

Accordingly, the support member 130 having the constant bending radius R at the side surface 132 is prepared.

The step S3 of coupling the display panel 110 and the support member 130 is finished by coupling the display panel 110 and the circuit portion 120 to the first optically transparent adhesive 136.

Then, referring to FIG. 7E, when coupling the display panel 110 to the support member 130 is finished, an optically polarizing member 113 is coupled to the display panel 110.

A vacuum auto roller VR, on the surface of which vacuum holes are formed, is coupled to the display panel 110, and then the display panel 110 is bent around the side surface having the bending radius R of the support member 130.

Figure 7F:
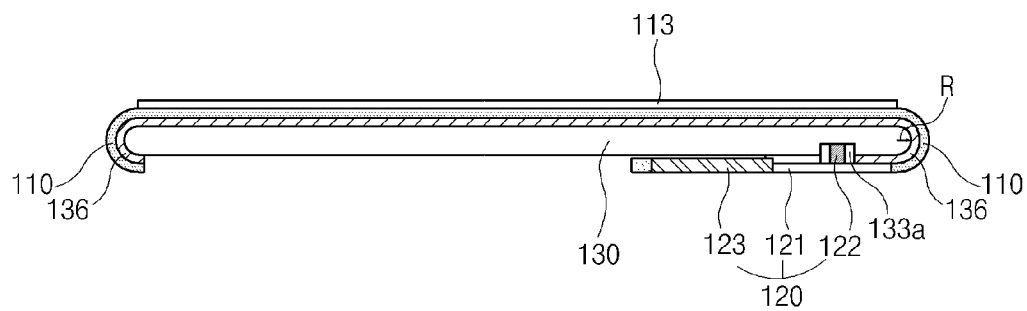

Accordingly, referring to FIGS. 2 and 7F, the non-active areas N/A1 and N/A2 of the display panel 110 may be selectively bent.

Besides the non-active areas N/A1 and N/A2, other non-active areas N/A of the display panel 110 shown in FIGS. 2 and 7D may be also bent.

A flexible display device according to another embodiment is explained as below, and explanations of parts similar to parts of the previous embodiment may be omitted.

Figure 8:
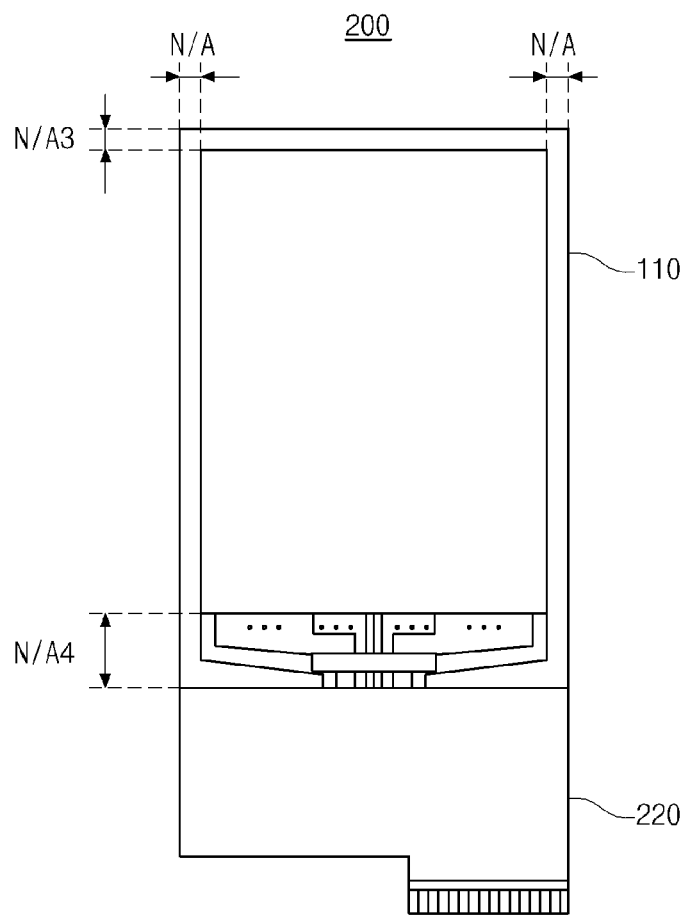
FIGS. 8 and 9 are a plan view and a cross-sectional view, respectively, illustrating a flexible display device before the device is bent according to another embodiment of the present invention.
Figure 9:
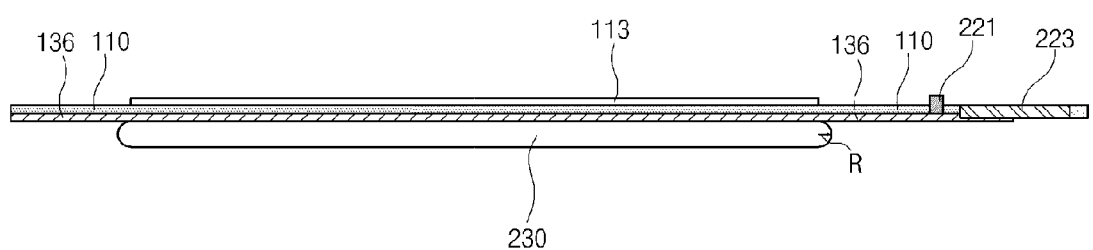

FIGS. 8 and 9 are a plan view and a cross-sectional view illustrating a flexible display device 200 before the device is bent according to another embodiment of the present invention.

As shown in the drawings, the flexible display device 200 includes a display panel 110, a circuit portion 220, and a support member 230. The display panel 110 and the circuit portion 220 are bent around the support member 230 so that the flexible display device 100 can be realized.

In more detail, the display panel 110 may be formed of a plastic substrate where an OLED and a TFT are formed, and non-luminous areas such as non-active areas N/A, N/A3, and N/A4 may be formed at a peripheral area of the display panel 110.

The circuit portion 220 applies a power signal and a data signal, which are supplied from the external portion, to the display panel 110.

The circuit portion 220 may be formed as a COG, and an IC element may be formed at the COG.

In more detail, referring to FIG. 9, the circuit portion 220 includes an IC element 221 coupled to the COG on a surface of the COG and a FPCB 223 supplied with the power signal and the data signal from the external portion.

The IC element 221 may be a drive-IC (D-IC) element.

Figure 10:
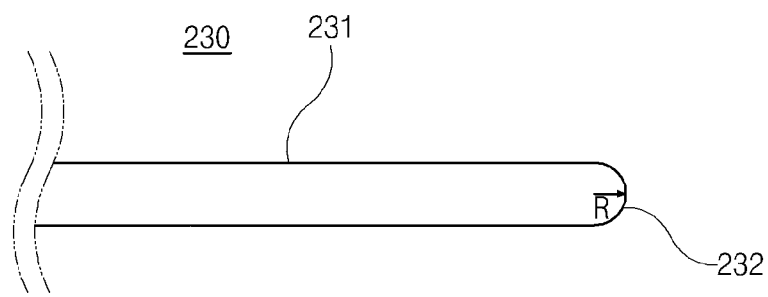
FIG. 10 is a cross-sectional view illustrating the support member according to another embodiment of the present invention.

Referring to FIG. 10, which is a cross-sectional view illustrating the support member 230 according to another embodiment of the present invention, the support member 230 is coupled to the plastic substrate that forms the display panel 110.

In more detail, the support member 230 includes a flat surface 231 coupled to the plastic substrate of the display panel 110 and a side surface 232 having a bending radius R at an outer rounded surface.

The display device 200 may be fabricated using the method described above with reference to FIGS. 7A to 7F, and at least one of the non-active areas N/A, N/A3 and N/A4 of the display panel 110 may be selectively bent.

Figure 11:
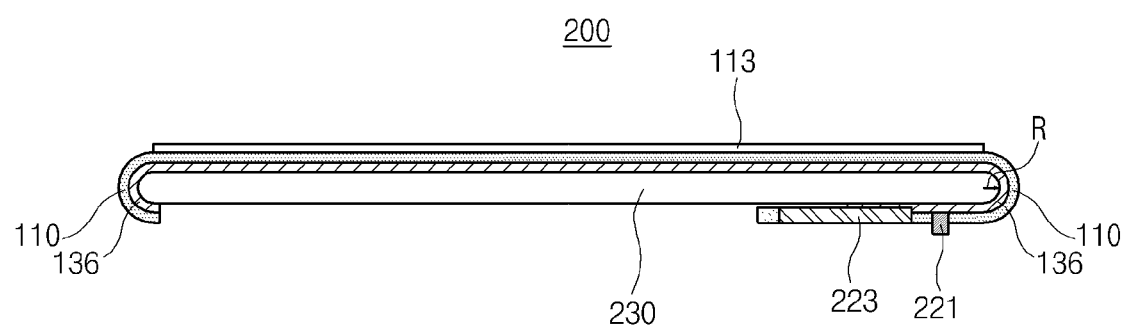
FIG. 11 is a cross-sectional view illustrating the flexible display device after the device is bent according to another embodiment of the present invention.

Accordingly, referring to FIG. 11, which is a cross-sectional view illustrating the flexible display device 200 after the device is bent according to another embodiment of the present invention, the non-active area N/A4 formed by the circuit portion 220 and the non-active area N/A3 formed at the top portion of the display panel 110 can be bent.

Besides the non-active areas N/A3 and N/A4, other non-display areas N/A of the display panel 110 may also be bent, similarly to FIG. 8.

As described above, in the flexible display device of the present invention, the plastic substrate is bent around the outer rounded surface of the support member, which advantageously prevents destruction of the bent portion.

Further, bending the non-active area (e.g., the bezel area) of the display device advantageously obtains a zero-bezel display device (i.e., a display device with substantially no bezel).

Further, since the non-active area (e.g., a bezel area) of the display device is bent, there is an advantage of miniaturizing the display device.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A flexible display device comprising:
   a display panel including a plastic substrate where an organic light emitting diode and a thin film transistor are formed;
   a circuit portion applying a power signal and a data signal, which are supplied from an external portion, to the display panel; and
   a support member coupled to the plastic substrate, the display panel and the circuit portion bent around the support member.

2. The device of claim 1, wherein the support member includes:
   a flat surface coupled to the plastic substrate; and
   a side surface with an outer rounded surface having a constant bending radius.

3. The device of claim 1, wherein the support member is made of one of SUS, Mg, rubber, graphene, Teflon, PDMS, urethane, and PVC films.

4. The device of claim 2, wherein a ratio of the bending radius to a thickness of the support member is between 0.2 and 0.8.

5. The device of claim 1, wherein the circuit portion is formed as a COF, and the COF includes an IC element.

6. The device of claim 5, wherein the support member includes an accommodation portion accommodating the IC element.

7. The device of claim 6, wherein the support member includes an insulator formed on an inner surface of the accommodation portion.

8. The device of claim 1, wherein the circuit portion is formed as a COG.

9. The device of claim 1, further comprising:
an optically transparent adhesive between the plastic substrate and the support member.

10. A method of fabricating a flexible display device, the method comprising:
preparing a display panel including a plastic substrate on which an organic light emitting diode and a thin film transistor are formed;
preparing a support member;
coupling the display panel to the support member; and
bending the display panel around a side surface of the support member.

11. The method of claim 10, wherein bending the display panel includes selectively bending at least one area of non-active areas of the display panel.

12. The method of claim 10, wherein preparing the support member includes forming a bending radius at a side surface of a base support member.

13. The method of claim 12, wherein forming the bending radius at the side surface of the base support member includes cutting round the side surface of the base support member such that an active-area of the display panel corresponds to the base support member.

14. The method of claim 12, wherein preparing the support member includes:
coating a first optically transparent adhesive on a first surface of the base support member before forming the bending radius at the base support member;
coating a second optically transparent adhesive on a second surface of the base support member, the second surface opposite the first surface; and
attaching protective films to the first and second optically transparent adhesives, respectively.

15. The method of claim 14, further comprising:
removing the protective film attached to the first optically transparent adhesive after cutting around the side surface of the base support member; and
removing the protective film attached to the second optically transparent adhesive, wherein coupling the display panel to the support member includes coupling the display panel to the first optically transparent adhesive.

16. The method of claim 10, further comprising:
coupling an optically polarizing member to the display panel after coupling the display panel to the support member.

\* \* \* \* \*